United States Patent
Brown et al.

(10) Patent No.: US 6,990,423 B2
(45) Date of Patent: Jan. 24, 2006

(54) APPARATUS AND METHOD FOR TESTING NON-DETERMINISTIC DEVICE DATA

(75) Inventors: Benjamin Brown, Lake Oswego, OR (US); Peter Huber, Waltham, MA (US); Mark Donahue, Sherwood, OR (US); John Pane, Tigard, OR (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/606,971

(22) Filed: Jun. 25, 2003

(65) Prior Publication Data

US 2004/0267487 A1  Dec. 30, 2004

(51) Int. Cl.
*G02F 3/00* (2006.01)

(52) U.S. Cl. .................. 702/117; 702/116; 702/121; 702/182

(58) Field of Classification Search ............... 702/116, 702/117, 121, 179, 182, 183; 340/825.52; 370/401; 713/192; 714/43
See application file for complete search history.

(56) References Cited

U.S. PATENT DOCUMENTS

| | | | | |
|---|---|---|---|---|
| 5,245,617 A | * | 9/1993 | DeSouza et al. | 714/766 |
| 5,379,289 A | * | 1/1995 | DeSouza et al. | 370/230 |
| 6,530,054 B2 | * | 3/2003 | Hollander | 714/739 |
| 6,601,195 B1 | * | 7/2003 | Chirashnya et al. | 714/43 |
| 2004/0107395 A1 | * | 6/2004 | Volkerink et al. | 714/732 |

* cited by examiner

Primary Examiner—Marc S. Hoff
Assistant Examiner—Felix Suarez
(74) Attorney, Agent, or Firm—Teradyne Legal Department

(57) ABSTRACT

Automatic test equipment for testing non-deterministic packet data from a device-under-test is disclosed. The automatic test equipment includes a memory for storing expected packet data and a receiver for receiving the packet data from the device-under-test. A data validation circuit is coupled to the receiver for validating non-deterministic packet data based on the expected packet data from the vector memory.

18 Claims, 8 Drawing Sheets

*Out of order data*

*Cycle Slipping*

APPARATUS AND METHOD FOR TESTING NON-DETERMINISTIC DEVICE DATA

FIELD OF THE INVENTION

The invention relates generally to automatic test equipment, and more particularly to circuits and methods for enabling the testing of non-deterministic semiconductor device data.

BACKGROUND OF THE INVENTION

Test is an important step in the manufacture of semiconductor devices. The automatic test equipment (ATE) employed to carry out this task comprises sophisticated electronics capable of sending-test signals to, and capturing output signals from, one or more devices under test (DUTs). ATE channel hardware, typically referred to as "channels", orchestrate this back and forth flow of signals.

Conventional channel circuitry, as shown in FIG. 1, feeds tester data signals (drive data) originating from a pattern generator 12 to a device-under-test (DUT) 14 via interface circuitry commonly referred to as pin electronics 16. Response signals from the DUT are captured and compared to expected data with the resulting comparison data fed to a failure processor 18 in order to determine pass or fail conditions. The "expected" and "drive" data are typically programmed in the pattern generator vector memory (not shown) to occur at precise timings, in accordance with how the DUT should behave. If the data captured from the DUT fails to correspond with an expected condition, the device is considered to have failed that aspect of the test.

Modem semiconductor devices are trending towards employing multiple processing cores on the same piece of silicon, or chip. Adding to this complexity is the overall trend towards implementing asynchronous on-chip communication protocols. The end result is an exponential increase in the chip gate count, yet only modest increases in the available pin counts. Consequently, multiple sub-circuits often share the pins (interface).

This shared interface scheme is illustrated generally in FIG. 2, where a plurality of device-under-test subcircuits 20a–20c send data packets to a DUT communications port 22. The communications port serves as the gatekeeper to accessing the DUT output pin 24. Each of the subcircuits may be clocked by a separate clock having a frequency different from not only the other subcircuits, but also possibly different from the communications port clock. An asynchronous arbitrator 26 handles the sequencing of the data packets to the DUT output pin.

During typical DUT operation, as shown in FIGS. 3A and 3B, the shared interface scheme may cause problems (for conventional ATE) known as "cycle slipping", and "out-of-order data". Cycle slipping often results from the communications port clock operating at a frequency different than that of the subcircuit clocks. The result may be that the DUT output pin sees periods of "idle" data, or a number of cycles of non-packetized information. These idle periods may occur at the beginning of a data transmission, or between packets of data.

Out-of-order data often results from the subcircuits attempting to access the communications port 22 (FIG. 2) on the same clock edge, or having differing delays due to environmental conditions. FIG. 3B illustrates the general concept on how an expected sequencing may be disturbed into an out-of-order packet sequence.

Both "cycle slipping" and "out of order" data present unique challenges to automatic test equipment. As previously described in the context of FIG. 1, traditional ATE relies on the comparison of expected data, at expected timings, to actual data and actual timings. Providing unknown and unexpected delay and data sequences in the actual DUT data for conventional ATE often results in post-test data descrambling to determine whether the device failed or passed. This may involve substantial modifications to the test program and create substantial overhead in program development and test time.

What is desired and currently unavailable is a test solution for non-deterministic data that provides substantially real-time validation results and maximizes flexibility for the device manufacturer while reducing test costs. The apparatus and method of the present invention provides such a solution.

SUMMARY OF THE INVENTION

The present invention provides the ability for automatic test equipment to quickly validate non-deterministic data received from a device-under-test having serial or serial-like ports. This ability is available with little impact to the automatic test equipment, and is protocol independent. With the availability of such a solution, users of the automatic test equipment with experience significant test throughput improvements and reduced test costs.

To realize the foregoing advantages, the invention in one form comprises automatic test equipment for testing non-deterministic packet data from a device-under-test. The automatic test equipment includes a memory for storing expected packet data and a receiver for receiving the packet data from the device-under-test. A data validation circuit is coupled to the receiver for validating non-deterministic packet data based on the expected packet data from the vector memory.

In a further form, the invention comprises automatic test equipment for testing non-deterministic packet data from a device-under-test, the automatic test equipment includes means for storing expected packet data, and means for receiving non-deterministic packet data from the device-under-test. The equipment further includes means for validating non-deterministic packet data based on the expected packet data from a vector memory.

In yet another form, the invention comprises a method for testing non-deterministic packet data using automatic test equipment having a memory for storing expected packet data. The method includes the steps of receiving actual non-deterministic packet data from a device-under-test; and validating the non-deterministic packet data based on the expected packet data from the vector memory.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The present invention provides a way to test semiconductor devices that generate non-deterministic output packet data exhibiting cycle-slipping, or out-of-order results. This is accomplished through the use of automatic test equipment 30 that employs a non-deterministic data validation circuit 50 capable of analyzing the non-deterministic packet data for a real-time determination of data validity.

Figure 1:
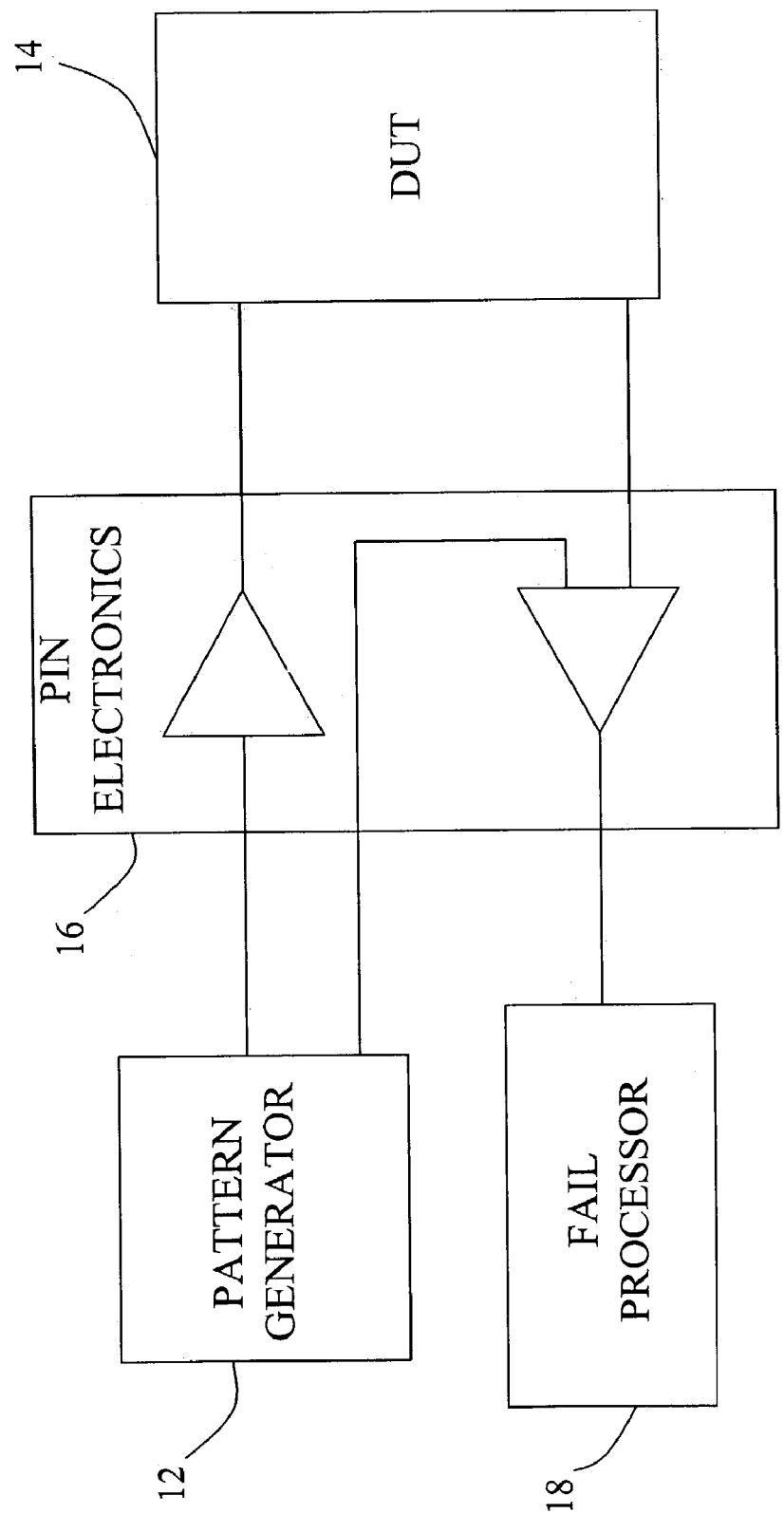
FIG. 1 is a high-level block diagram of a conventional ATE architecture for driving data to a DUT and comparing the DUT response data to expected data.
Figure 2:
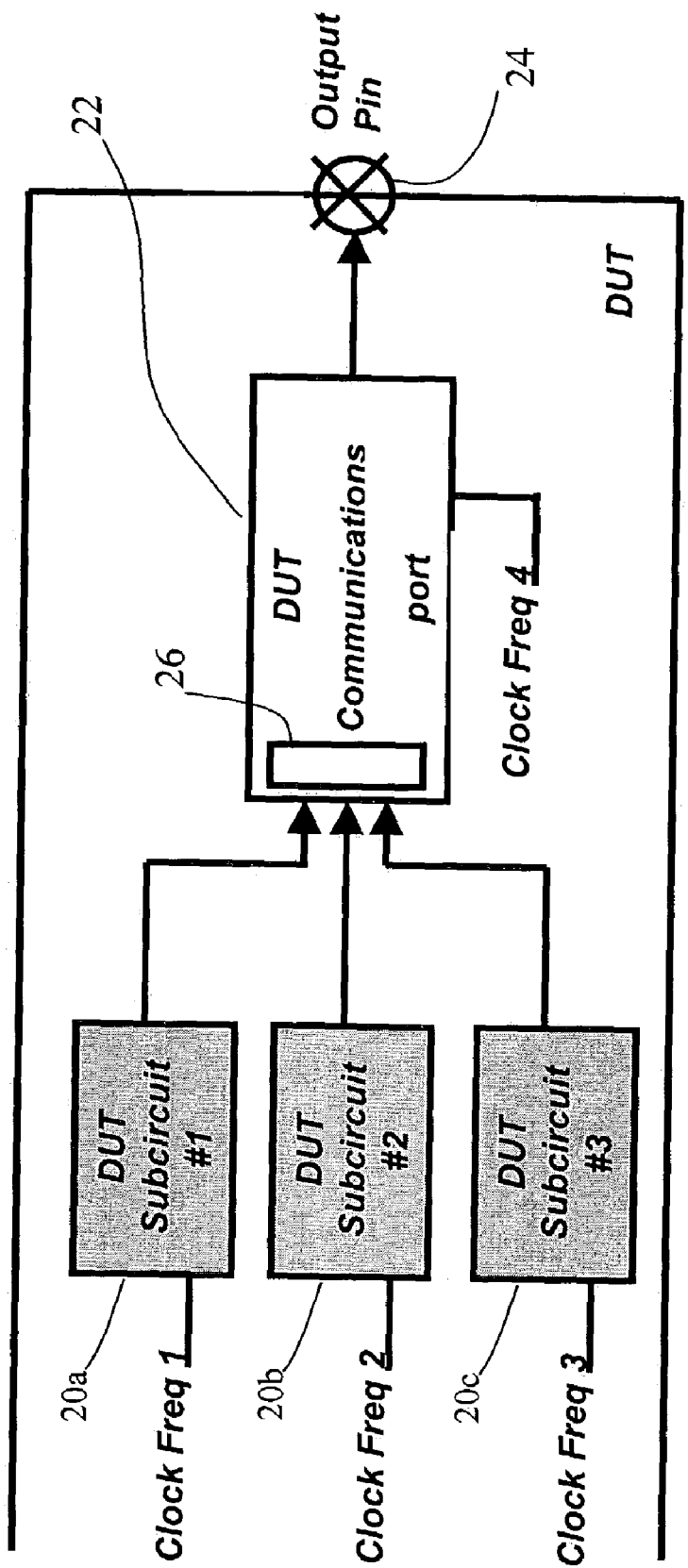
FIG. 2 is a high-level block diagram of a DUT output interface architecture.
Figure 3B:
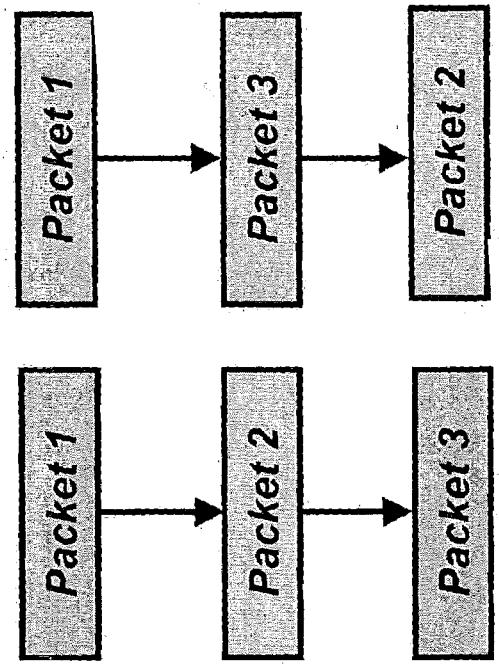
FIG. 3B is a block diagram illustrating the out of order problem resulting from the DUT output scheme of FIG. 2.
Figure 3A:
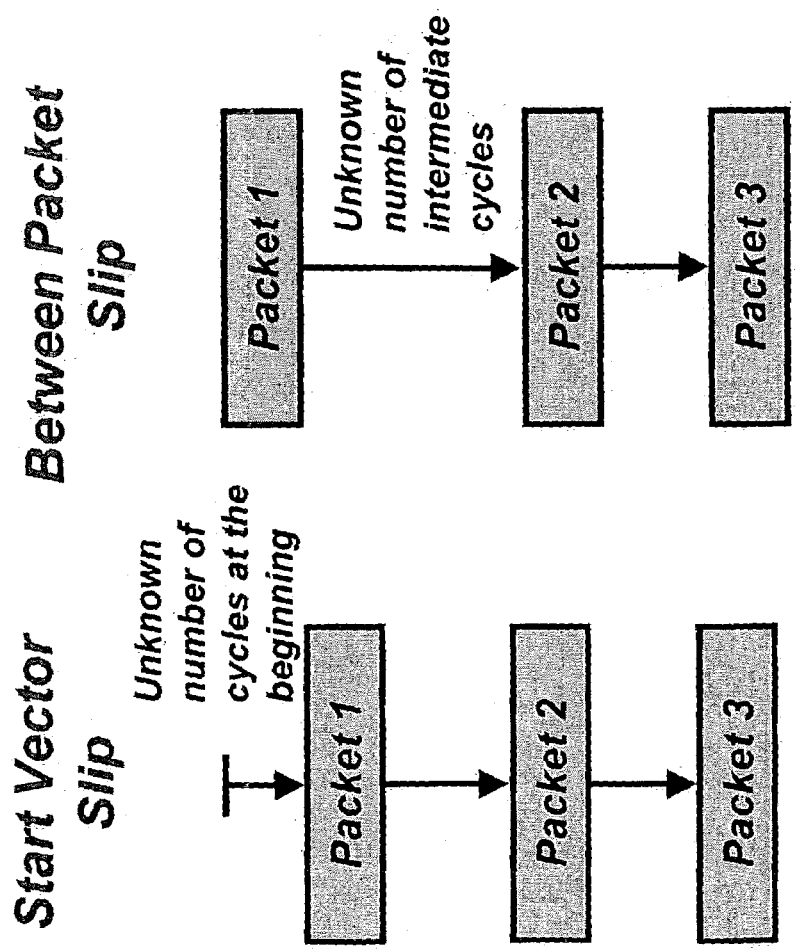
FIG. 3A is a block diagram illustrating the cycle slipping problem resulting from the DUT output scheme of FIG. 2.
Figure 4:
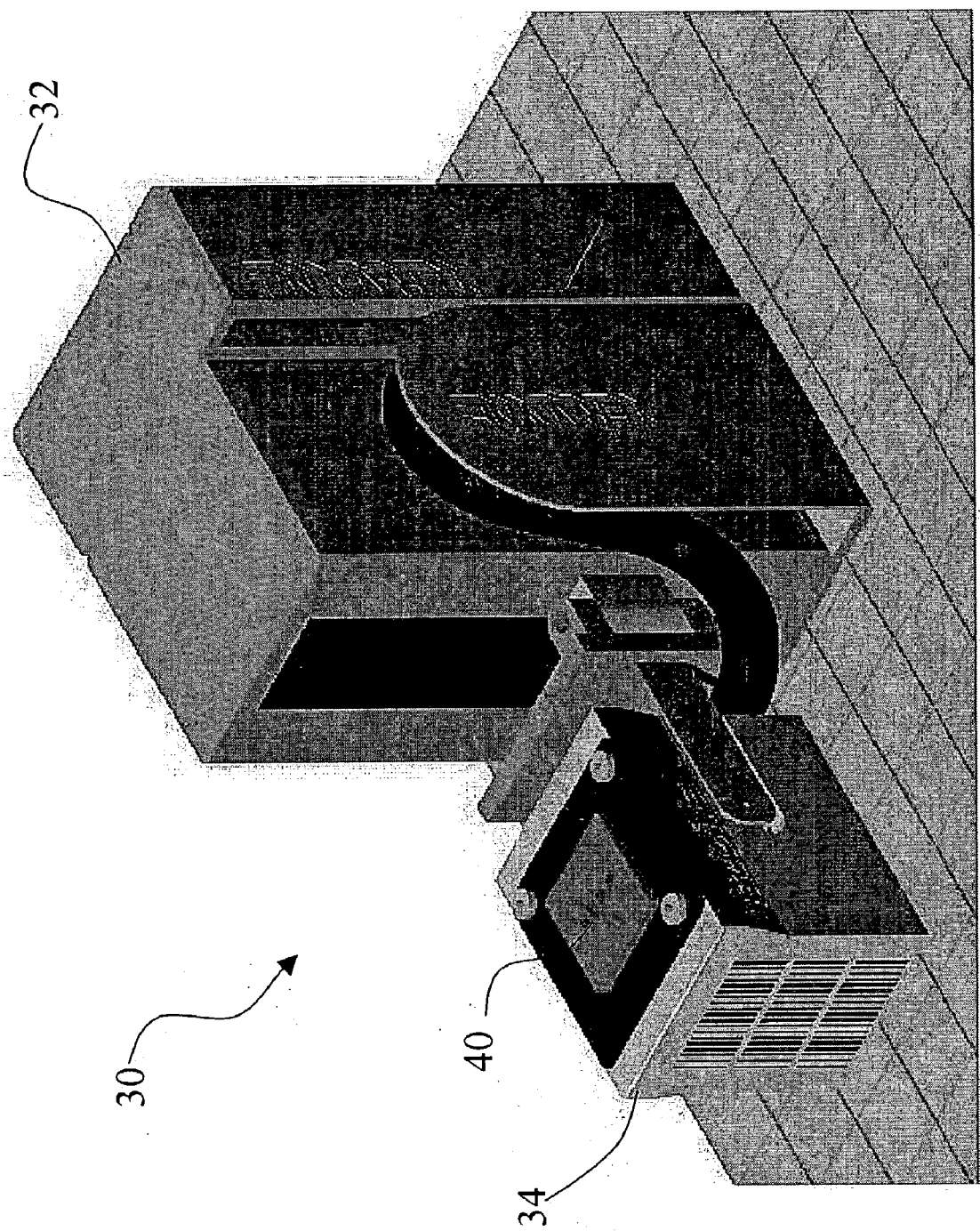
FIG. 4 is an elevated perspective view of automatic test equipment incorporating the data validation circuit of the present invention.

Referring now to FIG. 4, the automatic test equipment 30, often referred to as a semiconductor tester, includes a main console 32 coupled to a testhead 34. The testhead houses the various instruments desired by the user to adequately test a device-under-test DUT 40. The instruments generally comprise large circuit boards, or channel cards, that mount within the testhead in order to interface with the DUT in a controlled fashion.

Figure 5:
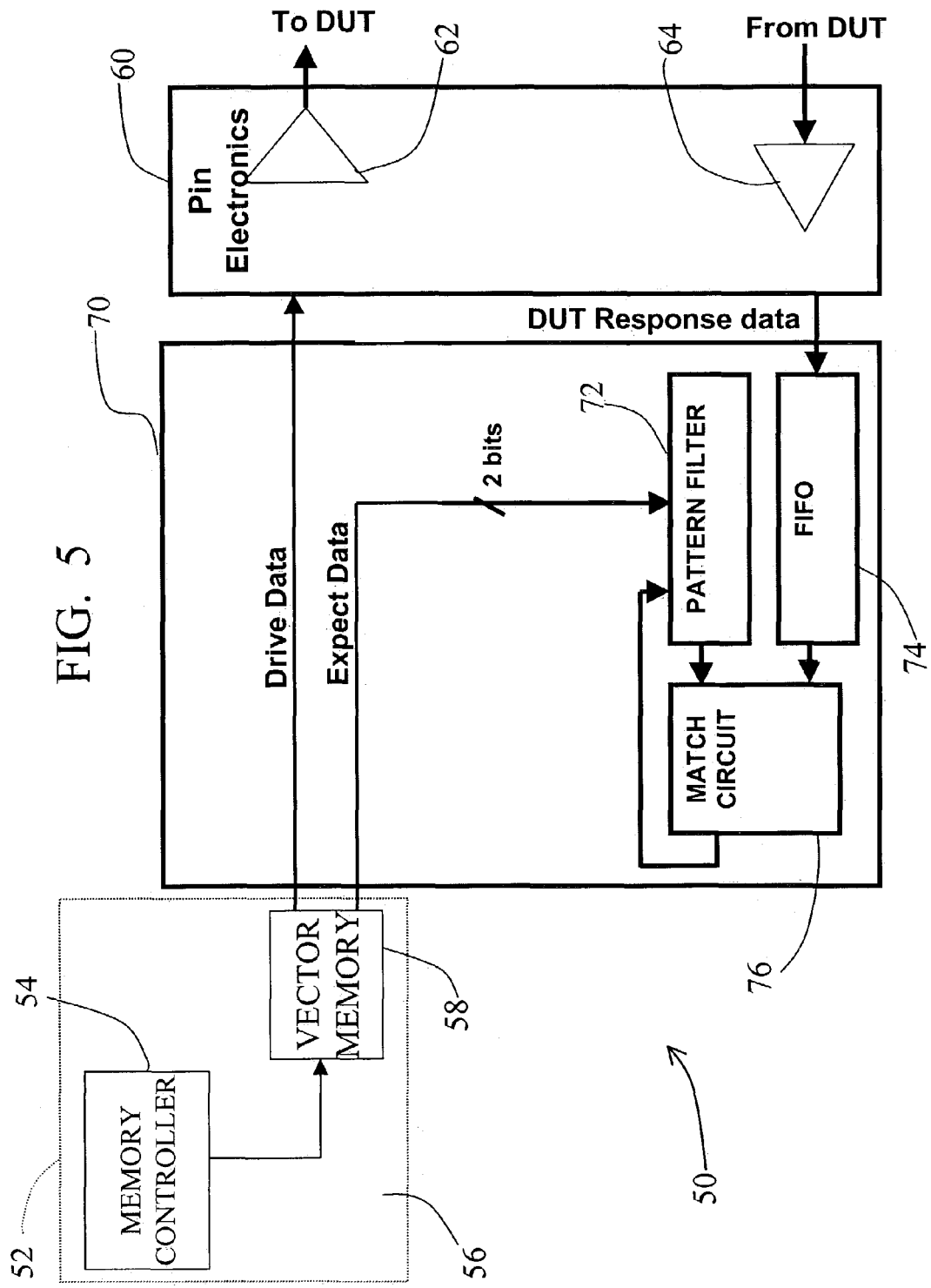
FIG. 5 is a block diagram of a circuit for testing non-deterministic data according to one form of the present invention.

With reference now to FIG. 5, the data validation circuit 50 of the present invention is preferably employed on a high-performance instrument capable of generating and receiving test signals to and from serial and serial-like data ports in accordance with SerDes and SerDes-like protocols. The circuit includes a pattern genertor 52, a processing circuit 70, and pin electronics circuitry 60 for interfacing the pattern generator and the processing circuitry with the DUT 40.

Further referring to FIG. 5, the pattern generator 52 includes a memory controller 54 responsive to a start signal for initiating access of a vector memory 58 to output data. In one form, the circuitry may be employed as a field-programmable-gate-array (FPGA) for high integration at low cost. Generally, test patterns stored in the vector memory include the cycle-by-cycle information for application to the DUT pins, and also the expected cycle-by-cycle data responsive to the applied test signals.

In some applications, however, the memory for pattern generation may be housed in the tester main console 32. Consequently, the location of the memory is unimportant for purposes of the present invention.

With continued reference to FIG. 5, the pin electronics circuitry 60 comprises high-speed drivers 62 and receivers 64 to provide a communication interface between the tester and the DUT 40. The present invention lends itself well to flexible channel architectures such that single-ended and differential drivers and receivers may be employed. Such constructions are well-known to those skilled in the art. A preferred pin electronics channel architecture that advantageously provides a flexible AC/DC coupled environment between the tester 30 and the DUT 40 is described in co-pending U.S. patent application Ser. No. 10/404,900, titled Hybrid AC/DC Coupled Channel For Automatic Test Equipment, filed Mar. 31, 2003, assigned to the assignee of the present invention, and expressly incorporated herein by reference.

With continued reference to FIG. 5, the processing circuit 70 provides the tester 30 (FIG. 4) with the capability of quickly evaluating non-deterministic packet data received from the DUT 40 (FIG. 4). The circuit includes a pattern filter 72 that optionally screens or masks idle data (or timing sequence data) from the pattern generator 52 to generate filtered expect data. A first-in-first-out (FIFO) circuit 74 is disposed in the receive data path and couples to the pin electronics receiver circuit 64 to pipeline the received packet data for comparison to the filtered expect data by a match circuit 76. The match circuit preferably includes a comparator (not shown) that provides a signal back to the pattern filter 72 and the FIFO 74 to load new data following successful data matches, as more fully described below.

In operation, drive data is sent from the pattern generator 52 via the pin electronics-drivers 62 to the DUT input ports. Expected data is also sent by the pattern generator to the pattern filter 72, while the actual data response signals from the DUT 40 are received by the pin electronics receivers 64. In a situation involving "cycle-slipping", the actual data may not show up at the originally expected cycle of tester operation, but yet still reflect an acceptable device signal behavior.

The processing circuit 70 handles the cycle-slipping situation by sequencing the data through the FIFO 74 in order of whatever packet arrived first, and comparing each packet of actual data to the filtered expected data (idle expected cycles filtered out). Following a successful data match, both the FIFO and the pattern filter 72 are loaded with new data to allow subsequent comparisons of packet data. If each piece of expected packet data matches each piece of actual data, then the device is deemed to have passed the test. If by the end of the test, the pattern generator 52 has not incremented through its expected data, then the DUT 40 is considered to have failed the test.

Figure 6:
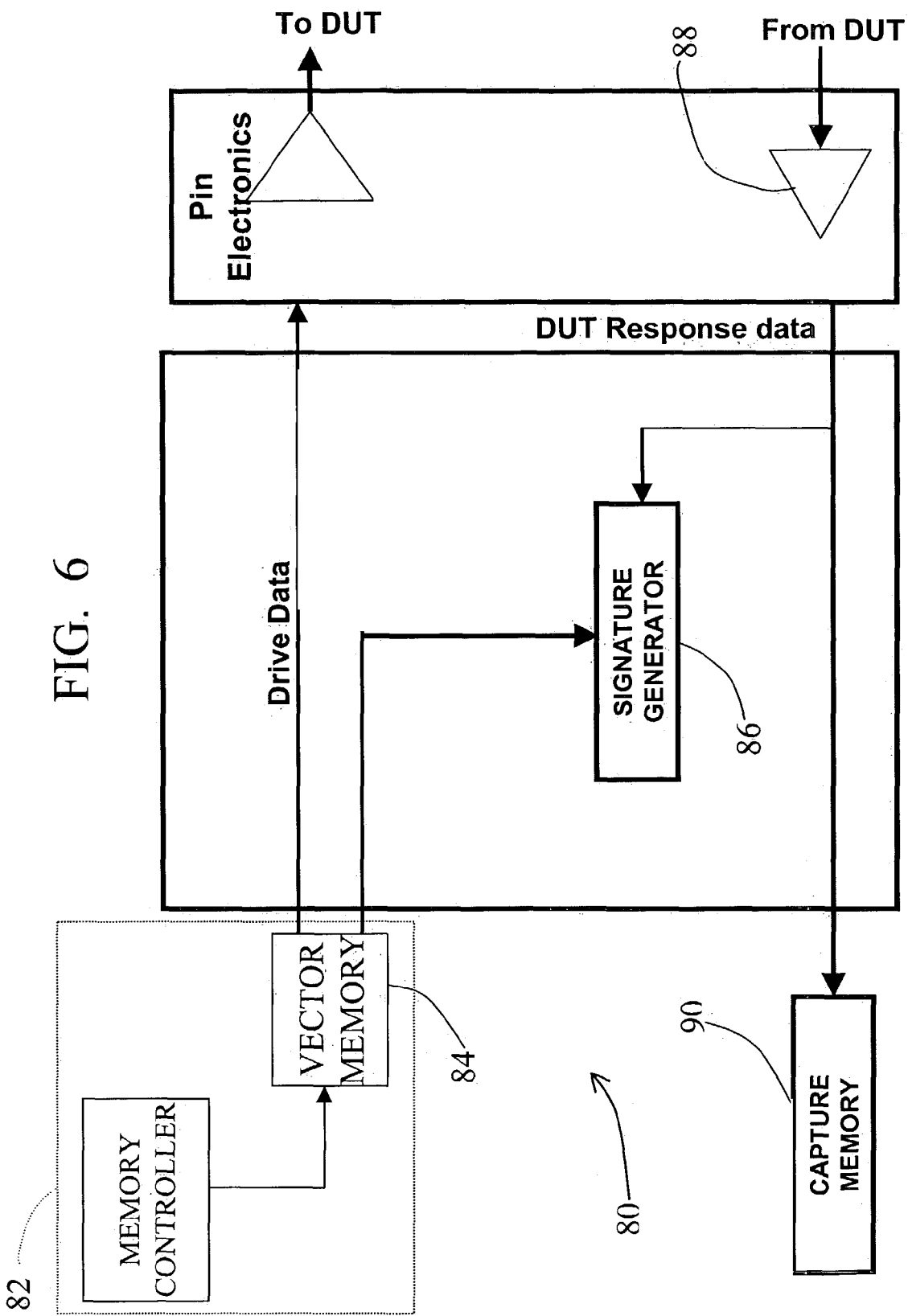
FIG. 6 is a block diagram of a circuit for testing non-deterministic data according to an alternative embodiment of the present invention.

Referring now to FIG. 6, a data validation circuit according to a second embodiment of the present invention, generally designated 80, provides the tester with the capability of handling packet data susceptible to both cycle-slipping and out-of-order results. The data validation circuit includes a pattern generator 82 with a memory controller 83 and a vector memory 84 (disposed locally inside the testhead or in the main tester console) that stores drive data similar to that stored in the first embodiment. However, the expected data is handled a bit differently. Instead of storing expected packet data into the vector memory, pre-calculated "signatures" are stored. The signatures correspond to calculated checksums based on acceptable output sequences for the DUT packet data. For some protocols, the number of acceptable signatures are relatively few, allowing for this kind of pre-calculated data signature validation.

With continued reference to FIG. 6, the vector memory 84 cooperates with a signature generator 86 in order to validate data received from the DUT 40 by pin electronics receivers 88. A signature generator such as a CRC arithmetic register, or linear feedback shift register is acceptable for this application. As noted above, the signature generator calculates a checksum (or "signature") from the sequence of actual data from the DUT, which is capable of being compared to the "expected" signature stored by the vector memory 84. The actual data from the DUT is also fed to a capture memory 90 to preserve the capability of analyzing the data in-depth following the test.

Figure 7:
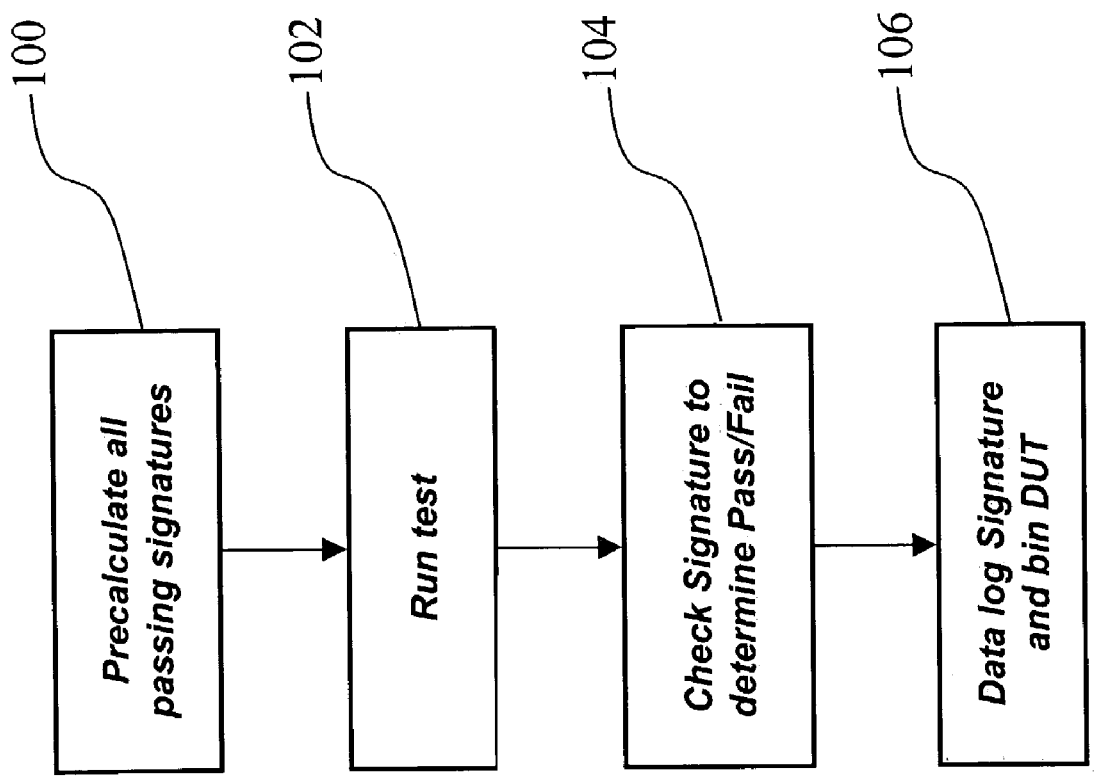
FIG. 7 is a flowchart of a method according to one form of the present invention for testing non-deterministic data with the circuit of FIG. 6.

In operation, as shown generally in FIG. 7, the user of the test equipment precalculates all known passing signatures, at step 100, corresponding to the expected data from the DUT 40. The test is then performed on the DUT, at step 102. Data captured from the DUT is then processed by the signature generator to form an actual signature, which is compared to the expected signature for a pass/fail determination, at step 104. The signature is then data logged, and the DUT binned, at step 106, according to its test results. This data signature scheme provides a predictable signature for a given stream of data, regardless of whether the data is affected by an out-of-order condition or cycle-slipping condition. Consequently, this allows the tester to evaluate a given DUT that may operate flawlessly under a wide range of operating conditions.

Figure 8:
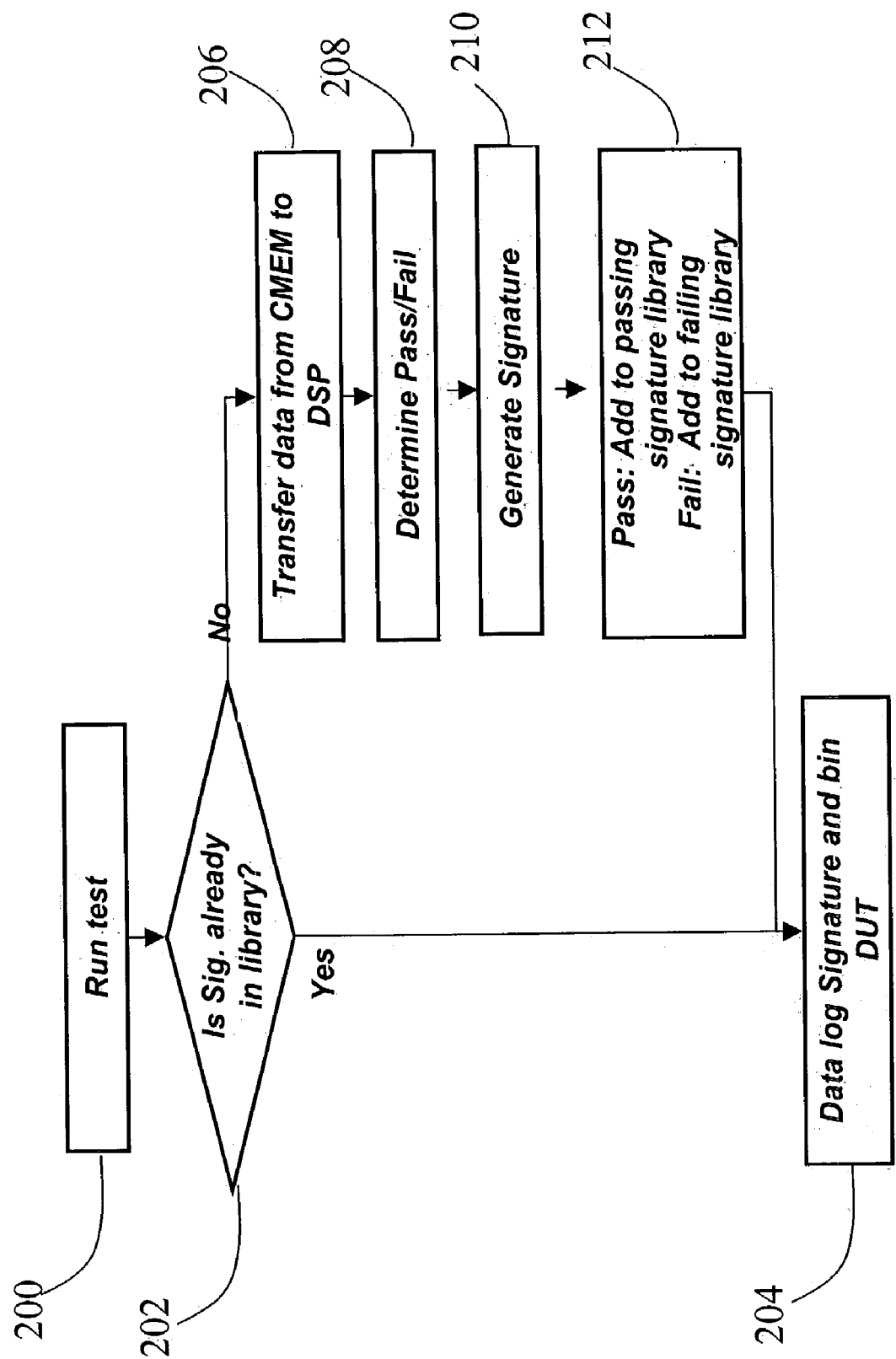
FIG. 8 is a flowchart of a method in accordance with another form of the present invention for testing non-deterministic data with the circuit of FIG. 6.

Alternatively, the signature method for evaluating non-deterministic data for automatic test equipment described above may employ an adaptive algorithm for those devices that may provide numerous passing signatures. This adaptive algorithm is illustrated generally in FIG. 8, and includes first running a test, at step 200. A determination is then made, at step 202, as to whether the detected signature from the DUT is already stored in the vector memory 84. If yes, then the signature is data logged, and the DUT binned, at step 204. If no, then the actual test data is transferred from the capture memory 90 to a processor (not shown), at step 206, to determine whether that sequence of data passed or failed, at step 208. If the data passed, then its signature is generated, at step 210, and added to the passing signature library, at step 212. If the data failed, then the failing signature is generated, at step 210, and added to the failing signature library, at step 212.

Those skilled in the art will recognize the many benefits and advantages afforded by the present invention. Of significant importance is the throughput improvement made possible by the data validation circuit to evaluate non-deterministic data in substantially real-time. This is true for both the FIFO-based and signature generator based implementations of the data validation circuit. Further, the circuit is protocol independent, thus serving a wide variety of serial and serial-like ports for semiconductor devices.

While the invention has been particularly shown and described with reference to the preferred embodiments thereof, it will be understood by those skilled in the art that various changes in form and detail may be made therein without departing from the spirit and scope of the invention. For example, the match circuit 76 is described herein as preferably comprising a comparator, although any circuit capable of performing a matching, or comparison, function may be utilized. In a similar manner, the signature generator is described as performing a checksum function to generate a signature. This is but one way to generate a signature for non-deterministic packet data. Many other ways of generating signatures are known in the art, and are within the scope of the present invention in the context of automatic test equipment.

What is claimed is:

1. Automatic test equipment for testing non-deterministic packet data from a device-under-test, the automatic test equipment including:
   a memory for storing expected packet data;
   a receiver for receiving actual packet data from the device-under-test; and
   a data validation circuit coupled to the receiver for validating the non-deterministic packet data based on the expected packet data from the memory, the data validation circuit comprising a first-in-first-out circuit having an input coupled to the receiver and a match circuit having a first input coupled to the first-in-first-out circuit and a second input coupled to the memory.

2. Automatic test equipment according to claim 1 wherein the match circuit includes
   a comparator operative to compare an output of the first-in-first-out circuit to the expected packet data from the memory.

3. Automatic test equipment according to claim 1, further including:
   a filter having an input coupled to the memory and an output coupled to the match circuit, the filter configured to mask idle packet data or timing sequence data.

4. Automatic test equipment according to claim 1 wherein the expected packet data includes expected signatures representing valid packet data combinations from the device-under-test, the data validation circuit including:
   a signature generator for generating actual signatures based upon actual packet data combinations received from the receiver; and
   a comparator for comparing the actual signatures to the expected signatures to identify valid packet data.

5. Automatic test equipment according to claim 4 and further including:
   a capture memory coupled to the receiver for storing the actual packet data received by the receiver.

6. Automatic test equipment according to claim 4 wherein the signature generator comprises a CRC arithmetic register.

7. Automatic test equipment according to claim 6 wherein the CRC arithmetic register comprises a linear feedback shift register.

8. Automatic test equipment for testing non-deterministic packet data from a device-under-test, the automatic test equipment including:
   means for storing expected packet data;
   means for receiving actual packet data from the device-under-test; and
   means for validating the non-deterministic packet data based on the expected packet data from the means for storing, the means for validating comprising a first-in-first-out circuit having an input coupled to the means for receiving and a match circuit having a first input coupled to the first-in-first-out circuit and a second input coupled to the means for storing.

9. Automatic test equipment according to claim 8 wherein the match circuit includes
   a comparator operative to compare an output of the first-in-first-out circuit to the expected packet data from the means for storing expected packet data.

10. Automatic test equipment according to claim 8 wherein the means for storing expected packet data includes means for storing expected signatures representing valid packet data combinations from the device-under-test, the means for validating including:
    means for generating a signature based upon actual packet data combinations received from the receiver; and
    means for comparing the actual signatures to the expected signatures to identify valid packet data.

11. Automatic test equipment according to claim 8 and further including:
    means for capturing the actual packet data from the receiver.

12. Automatic test equipment according to claim 10 wherein the means for generating a signature includes:
a CRC arithmetic register.

13. Automatic test equipment according to claim 12 wherein the CRC arithmetic register comprises:
a linear feedback shift register.

14. A method for testing non-deterministic packet data using automatic test equipment having a memory for storing expected packet data, the method comprising:
receiving actual packet data from a device-under-test;
sequencing the actual packet data through a first-in-first out circuit;
comparing, in the order received, each actual packet data to the expected packet data in the memory; and
validating the non-deterministic packet data based on the comparing step.

15. A method according to claim 14 wherein the expected packet data includes idle data or timing sequence data, the method further comprising:
filtering the idle data or timing sequence data to generate filtered expected data, and wherein the comparing step includes comparing, in the order received, each actual packet data to the filtered expected packet data.

16. A method according to claim 14 wherein the memory stores expected signatures representing valid packet data combinations from the device-under-test, the method further comprising:
generating an actual signature for each actual data packet, wherein the comparing step includes comparing the generated actual signature to the expected signatures and the validating step includes determining whether the actual data packet passed or failed based on the comparison of the actual and expected signatures.

17. A method according to claim 16 wherein the step of generating an actual signature includes:
calculating a checksum from the actual packet data.

18. A method for validating non-deterministic packet data from a device-under-test using automatic test equipment, the automatic test equipment having a memory, the method comprising:
establishing a library of known signatures in the memory, wherein the known signatures are passing signatures, failing signatures or both;
testing the device-under-test;
generating a signature of actual packet data captured during the testing step;
comparing the generated signature from the captured data to the library of known signatures;
determining a pass/fail result for the device test if the compared signature matches at least one known signature in the library;
evaluating the captured data to determine whether the device passed/failed if the compared signature does not match at least one known signature in the library;
generating a new signature for the evaluated captured data; and
adding the new signature to the library of known signatures.

* * * * *